United States Patent
Yamada et al.

(10) Patent No.: US 7,589,543 B2
(45) Date of Patent: Sep. 15, 2009

(54) PROBE CARD HAVING A CONDUCTIVE THIN FILM ON THE SURFACE OF AN INSULATING FILM BEHIND EACH OF THE ALIGNMENT MARKS EACH MARKS COMPRISES A PLURALITY OF SECOND BUMPS

(75) Inventors: Kenji Yamada, Hirakata (JP); Yoshirou Nakata, Souraku-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/299,656

(22) Filed: Dec. 13, 2005

(65) Prior Publication Data

US 2006/0132155 A1 Jun. 22, 2006

(30) Foreign Application Priority Data

Dec. 20, 2004 (JP) ............................. 2004-366936

(51) Int. Cl.
*G01R 31/02* (2006.01)
(52) U.S. Cl. ...................................... 324/758; 324/754
(58) Field of Classification Search ................... None
See application file for complete search history.

(56) References Cited

U.S. PATENT DOCUMENTS 6,486,954 B1    11/2002    Mieher et al. ............... 356/401
6,933,738 B2 *  8/2005     Martin et al. ................ 324/758
7,129,730 B2 * 10/2006     Liu et al. ..................... 324/758
2004/0201392 A1* 10/2004   Kim et al. .................... 324/758

FOREIGN PATENT DOCUMENTS

| JP | 07231019 A    |   | 8/1995 |
| JP | 11154694 A    | * | 6/1999 |
| JP | 2006173503 A  | * | 6/2006 |

* cited by examiner

*Primary Examiner*—Paresh Patel
(74) *Attorney, Agent, or Firm*—Steptoe & Johnson LLP

(57) ABSTRACT

A probe card for a wafer level test of electrical characteristics of a plurality of semiconductor integrated circuit devices formed on a semiconductor wafer. The card has a thin film with bumps on which a plurality of bumps to be respectively brought into contact with all of inspection electrodes of the semiconductor integrated circuit devices are formed, and which is held on a rigid ceramic ring. An alignment mark constituted by a bump formed simultaneously with the bumps for contact is added to the thin film with bumps. The desired position of the alignment mark relative to the bumps for contact is maintained. Therefore, a change in position accuracy of the bumps for contact can be easily measured by an image processor with reference to the alignment mark. An optimum position for contact between the wafer to be inspected and the inspection electrodes on the wafer can be computed from the measurement result.

2 Claims, 9 Drawing Sheets

PROBE CARD HAVING A CONDUCTIVE THIN FILM ON THE SURFACE OF AN INSULATING FILM BEHIND EACH OF THE ALIGNMENT MARKS EACH MARKS COMPRISES A PLURALITY OF SECOND BUMPS

CLAIM OF PRIORITY

This application claims priority under 35 USC 119 to Japanese Patent Application No. 2004-366936, filed on Dec. 20, 2004, the entire contents of which is hereby incorporated by reference.

FIELD OF THE INVENTION

The present invention relates to a probe card for performing a wafer level test on a single wafer basis of electrical characteristics of semiconductor integrated circuit devices formed on a semiconductor wafer, a method of manufacturing the probe card, and an alignment method.

BACKGROUND OF THE INVENTION

In recent years, remarkable progress has been made in reducing the size and price of electronic appliances incorporating semiconductor integrated circuit devices (hereinafter referred to as "semiconductor devices"), and the demand for reducing the size and price of semiconductor devices has become stronger.

Conventionally, a semiconductor device is provided in a state in which a semiconductor chip and leads for forming external terminals are electrically connected by bonding wires and are encapsulated in a resin or a ceramic. The semiconductor device provided in such a state is mounted on a circuit board. However, a method of mounting on a circuit board a semiconductor chip as it is after being cut out from a semiconductor wafer is becoming a main stream because of the demand for reducing the size of electronic appliances. There is a strong demand for assuring the desired quality of such a semiconductor chip (bare chip) and providing the semiconductor chip at a low price.

Assurance of the quality of semiconductor chips requires a test such as a burn-in test of the semiconductor chips in a wafer state, i.e., semiconductor integrated circuit devices formed on a wafer. In this test, it is impractical, in terms of time and in terms of cost, to test the plurality of semiconductor integrated circuit devices on the wafer one by one or to perform rounds of tests of separated groups of the semiconductor integrated circuit devices each consisting of several ones of the circuit units. A wafer level test method for all of a plurality of semiconductor integrated circuit devices on a wafer by a burn-in test or the like has therefore been developed.

A wafer level test of all semiconductor integrated circuit devices on a wafer requires operating the semiconductor integrated circuit devices by simultaneously applying power supply voltages and signals to electrodes of the semiconductor integrated circuit devices. This test requires the provision of a probe card having a large number of (ordinarily, several ten thousands of) contactors capable of contacting the electrodes of all the semiconductor integrated circuit devices on the wafer. As this probe card, the conventional needle-type probe card, i.e., a type of probe card on which probe needles are arrayed, is not adaptable in terms of number of pins and in terms of price. By considering this, a method has been proposed in which a multiplicity of bumps are formed on a probe card to be used as probe electrodes (see, for example, Japanese Patent Laid-Open No. 7-231019).

In bringing a multiplicity of bumps of a probe card into contact with a multiplicity of corresponding electrodes on a wafer with reliability, there is a need to accurately position (align) the probe card and the wafer while observing the placement of the bumps. Ordinarily, this positioning is performed by relatively moving the wafer while referring to the bumps on the probe card fixed on a particular portion of an alignment apparatus through image processing in a recognition device. A method has also been proposed in which alignment marks such as openings are added to a probe card to be used as a contact-position reference (see, for example, Japanese Patent Laid-Open No. 11-154694).

However, a positional deviation of bumps formed on a probe card occurs easily due to a variation caused at the time of manufacture or a thermal cycle during characteristic inspection. The alignment method using bumps as a reference, therefore, entails a possibility of failure to achieve accurate contact due to a positional deviation of the bumps used as a reference. Since the size of the bumps are extremely small, image processing in a recognition device is considerably difficult to perform and there is a possibility of occurrence of an error in image processing.

In the alignment method using special alignment marks, the alignment marks are added after the formation of bumps by considering the position accuracy of the bumps. However, this method is capable of coping only with the problem relating to the position accuracy at the time of manufacture of a probe card and is incapable of coping with, for example, a change due to a thermal cycle after manufacture of the probe card. Since the alignment marks are formed not simultaneously with the formation of the bumps, there is a possibility of occurrence of an accuracy error with respect to the positions of the bumps in the alignment mark addition step.

DISCLOSURE OF THE INVENTION

In view of the above-described problems, an object of the present invention is to provide a probe card capable of contacting a multiplicity of electrodes on a wafer at an optimum position at the time of a wafer level test on a single wafer basis, and an alignment method.

To achieve the above-described object, according to the present invention, there is provided a probe card for a wafer level test of electrical characteristics of a plurality of semiconductor integrated circuit devices formed on a semiconductor wafer, the probe card being constructed so as to have a thin film with bumps on which a plurality of bumps to be respectively brought into contact with all of inspection electrodes of the plurality of semiconductor integrated circuit devices are formed, and which is held on a rigid ring, wherein an alignment mark constituted by a bump formed simultaneously with the bumps for contact is added to the thin film with bumps.

In this probe card, the bump constituting the alignment mark is formed simultaneously with the bumps for contact. Therefore the position of the thin film relative to the bumps for contact can be maintained even when the thin film expands or shrinks.

Preferably, the alignment mark is formed by arraying a plurality of bumps. Preferably, a thin film from which a light-dark contrast with the bumps is produced in image processing using a recognition camera is formed largely relative to the alignment mark on the surface of the thin film with bumps opposite from the alignment mark. Further, preferably, at least two pairs of the alignment marks each consisting of two alignment marks symmetric about a center of the thin film with bumps are formed on the outer periphery side of a region where the bumps for contact are formed.

When the probe card of the present invention is manufactured, such a process may be performed that includes a step of attaching, to a rigid ring, a thin film of a double structure in which an electroconductive layer and an insulating layer are superposed on each other, a step of simultaneously forming, on the thin film attached to the rigid ring, a plurality of bumps to be respectively brought into contact with all of inspection electrodes of the plurality of semiconductor integrated circuit devices on the semiconductor wafer, and a bump provided to form an alignment mark, a step of removing an unnecessary portion of the conductive layer from the thin film on which the bumps have been formed, and a step of electrically connecting and fixing, to a wiring substrate, the thin film with bumps on which the bumps have been formed and from which the unnecessary portion of the conductive layer has been removed.

When the probe card of the present invention is used and positioning between the probe card and the semiconductor wafer is performed with reference to the alignment mark on the probe card, a bump position at which the bumps for contact can be reliably brought into contact with the inspection electrodes on the wafer can be computed to enable alignment at an optimum position.

It is preferable to use the probe card having a plurality of alignment marks, to measure the positions of the individual alignment marks of the probe card by image processing, before positioning, to compare the measured positions with designed positions of the alignment marks and compute an error between the measured positions and the designed positions, and to replace the probe card if the computed error is not within a predetermined tolerance.

DESCRIPTION OF THE EMBODIMENT

The present invention will be described with respect to an embodiment thereof.

To facilitate understanding of the present invention, a wafer-batch contact technique will be described.

Figure 1A:
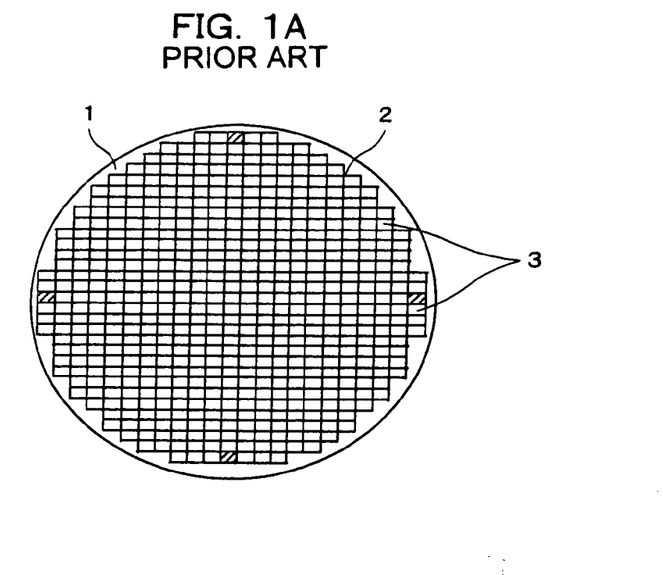
FIG. 1A is a plan view of a conventional wafer to be inspected by using a probe card of the present invention.
Figure 1B:
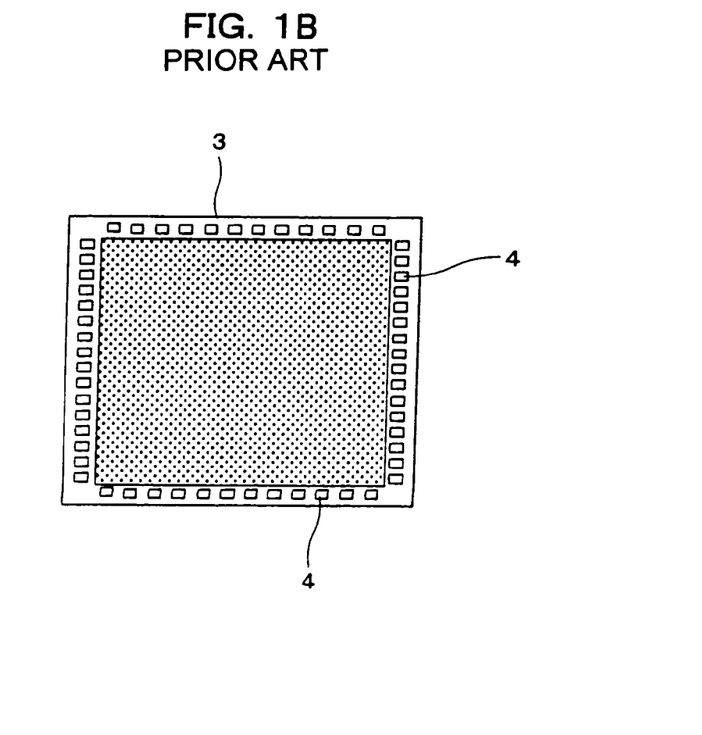
FIG. 1B is a plan view of a semiconductor integrated circuit device in the wafer shown in FIG. 1A.

As shown in FIGS. 1A and 1B, pad electrodes 4 (hereinafter referred to simply as electrodes 4) for inspecting electrical characteristics are formed on each of a plurality of semiconductor integrated circuit devices 3 formed in a semiconductor integrated circuit device region 2 of a wafer 1.

Figure 2:
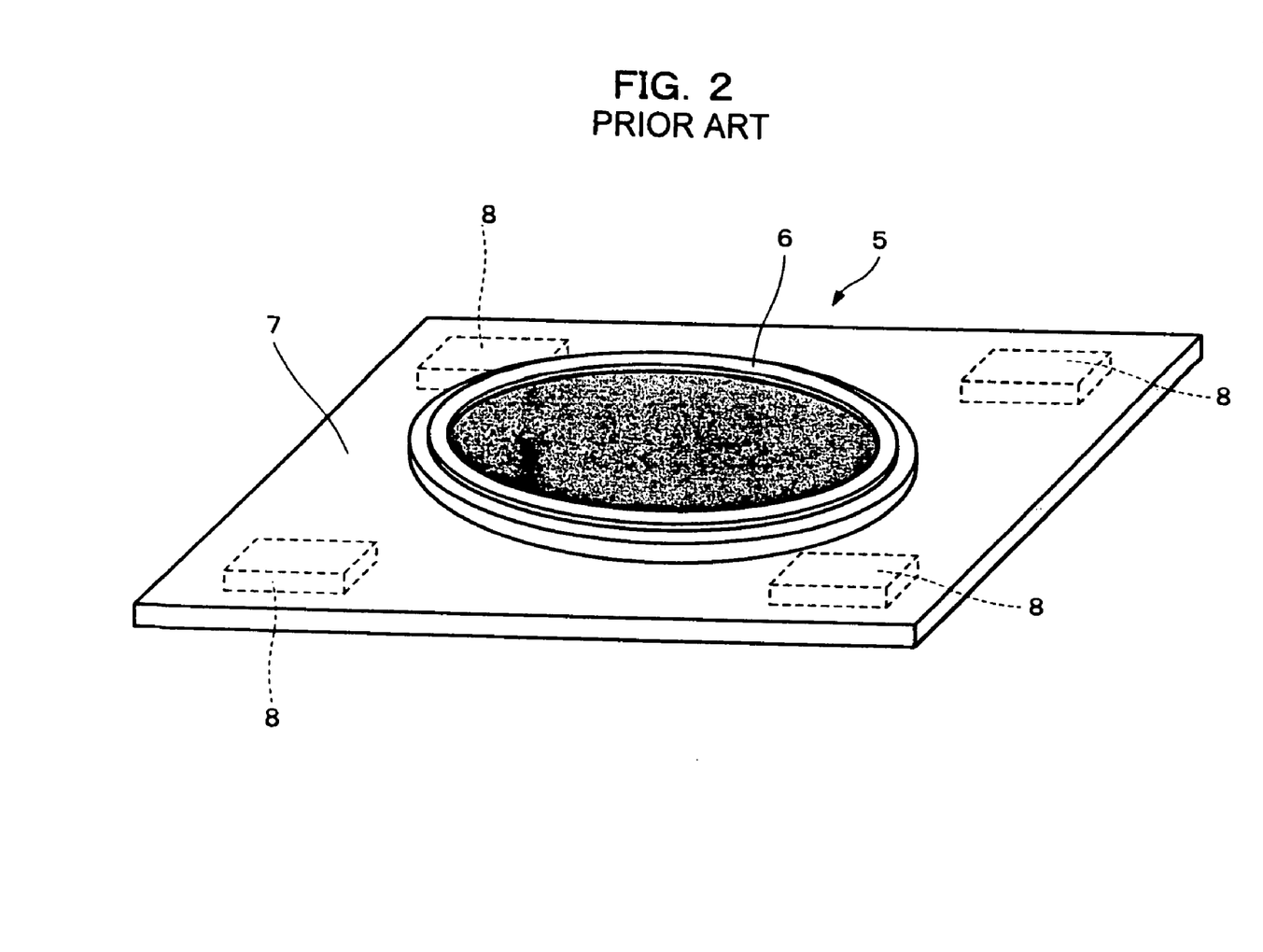
FIG. 2 is a schematic perspective view of the construction of a conventional inspection board on which the probe card of the present invention is fixed.

As shown in FIG. 2, an inspection board 5 is constituted by a probe card 6 and a multilayer circuit board 7 for establishing electrical connections between the probe card 6 and an inspection system. Reference numeral 8 denotes a plurality of connectors provided on a back surface of the multilayer wiring board 7.

Figure 3A:
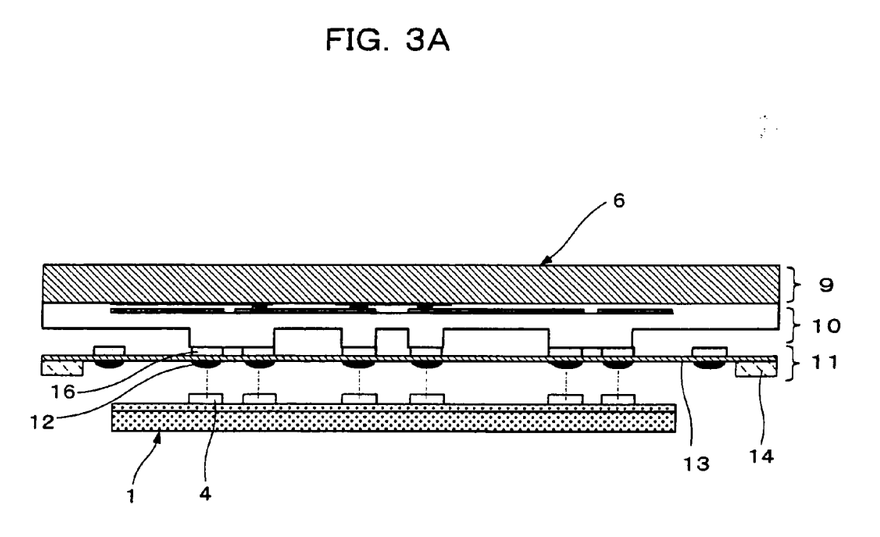
FIG. 3A is a sectional view of the probe card of the present invention.
Figure 3B:
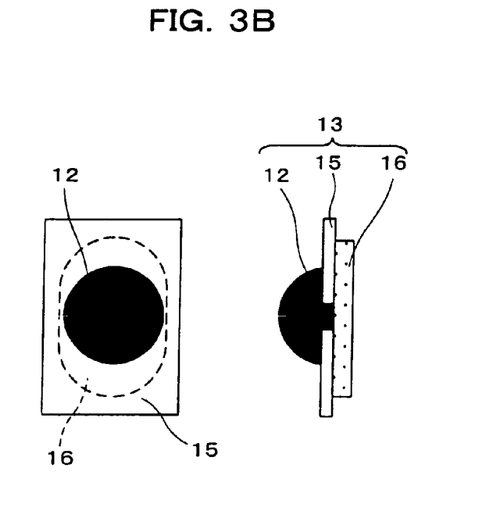
FIG. 3B is an enlarged sectional view of a portion of the probe card shown in FIG. 3A.

As shown in FIGS. 3A and 3B, the probe card 6 is formed of a glass substrate 9, localized anisotropic conductive rubber 10 and a contact probe 11. The glass substrate 9 is a wiring substrate for connection between the electrical connection points on the contact probe 11 and the multilayer circuit board 7 in the inspection board 5.

In the contact probe 11, a peripheral portion of a thin film 13 with bumps, on which bumps 12 are formed, is supported by a ceramic ring 14. The thin film 13 with bumps includes a thin film 15 on which bumps 12 are formed by a plating technique. Each bump 12 has a semispheric shape. A copper thin film 16 is provided on a back surface of the thin film 15 opposite from the bumps 12 to form a plating on the bumps 12 and to improve electrical conduction between the bumps and the localized anisotropic conductive rubber 10.

The localized anisotropic conductive rubber 10 provides electrical conduction between the contact probe 11 and the glass substrate 9 while functioning as a cushion to absorb variations in height of the electrodes 4 on the wafer 1 and the bumps 12 on the contact probe 11.

Figure 4A:
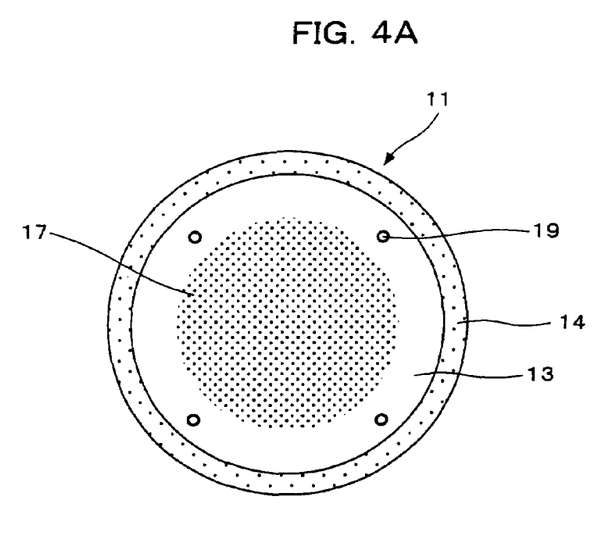
FIG. 4A is a plan view of a contact probe of the probe card of the present invention.
Figure 4B:
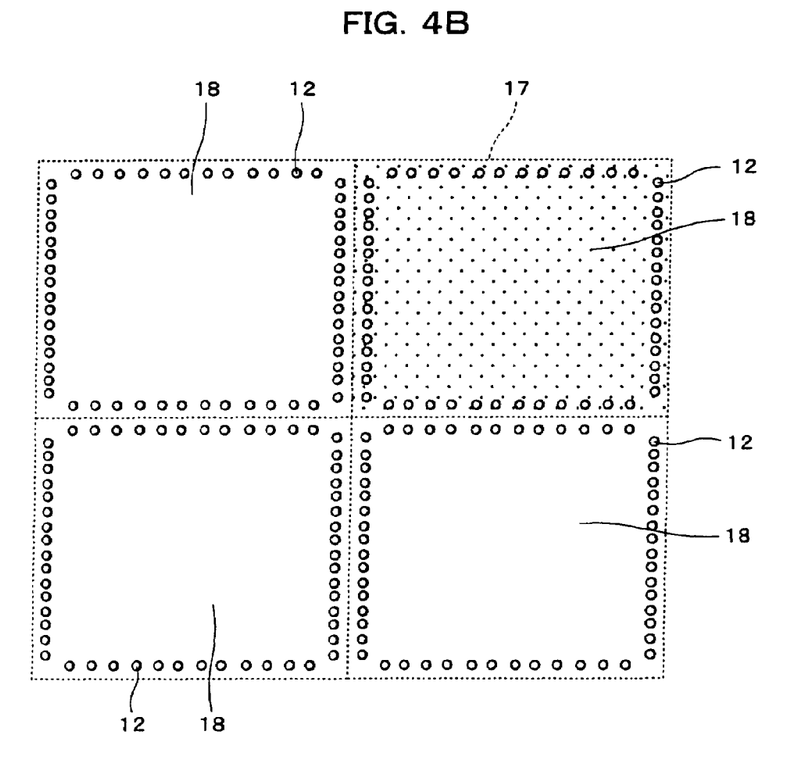
FIG. 4B is an enlarged sectional view of a portion of the contact probe shown in FIG. 4A.

As shown in FIGS. 4A and 4B, a measurement bump area 17 corresponding to the semiconductor integrated circuit device region 2 of the wafer 1 shown in FIG. 1 exists at a center of the contact probe 11, and the bumps 12 are arrayed in each of a plurality of semiconductor integrated circuit device areas 18 set in the measurement bump area 17 in correspondence with the electrodes 4 of the semiconductor integrated circuit device 3. Alignment marks 19 used as a reference for positioning with respect to the wafer 1 are formed in an outer peripheral portion of the contact probe 11. In this embodiment, two symmetric pairs of alignment marks 19 are provided, that is, two alignment marks 19 in each pair are placed symmetrically about a center of the contact probe 11. The alignment marks 19 will be described below.

Figure 5:
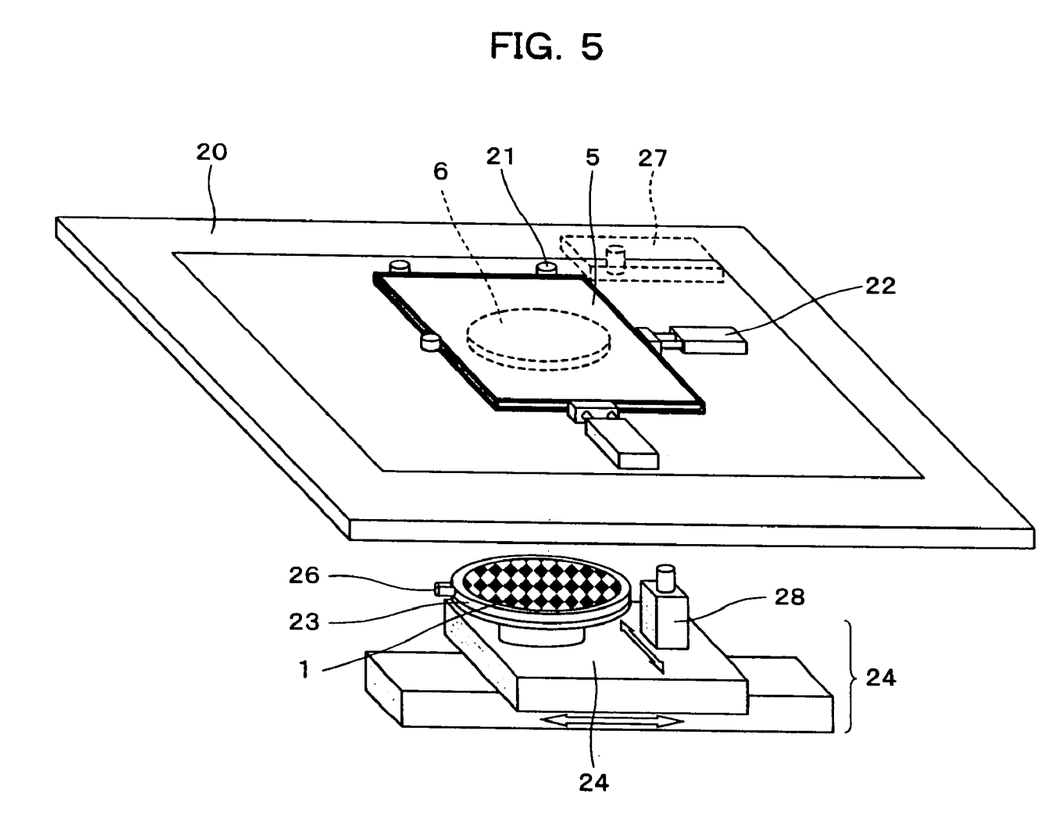
FIG. 5 is a perspective view of the construction of a conventional alignment apparatus using the probe card of the present invention.
Figure 6:
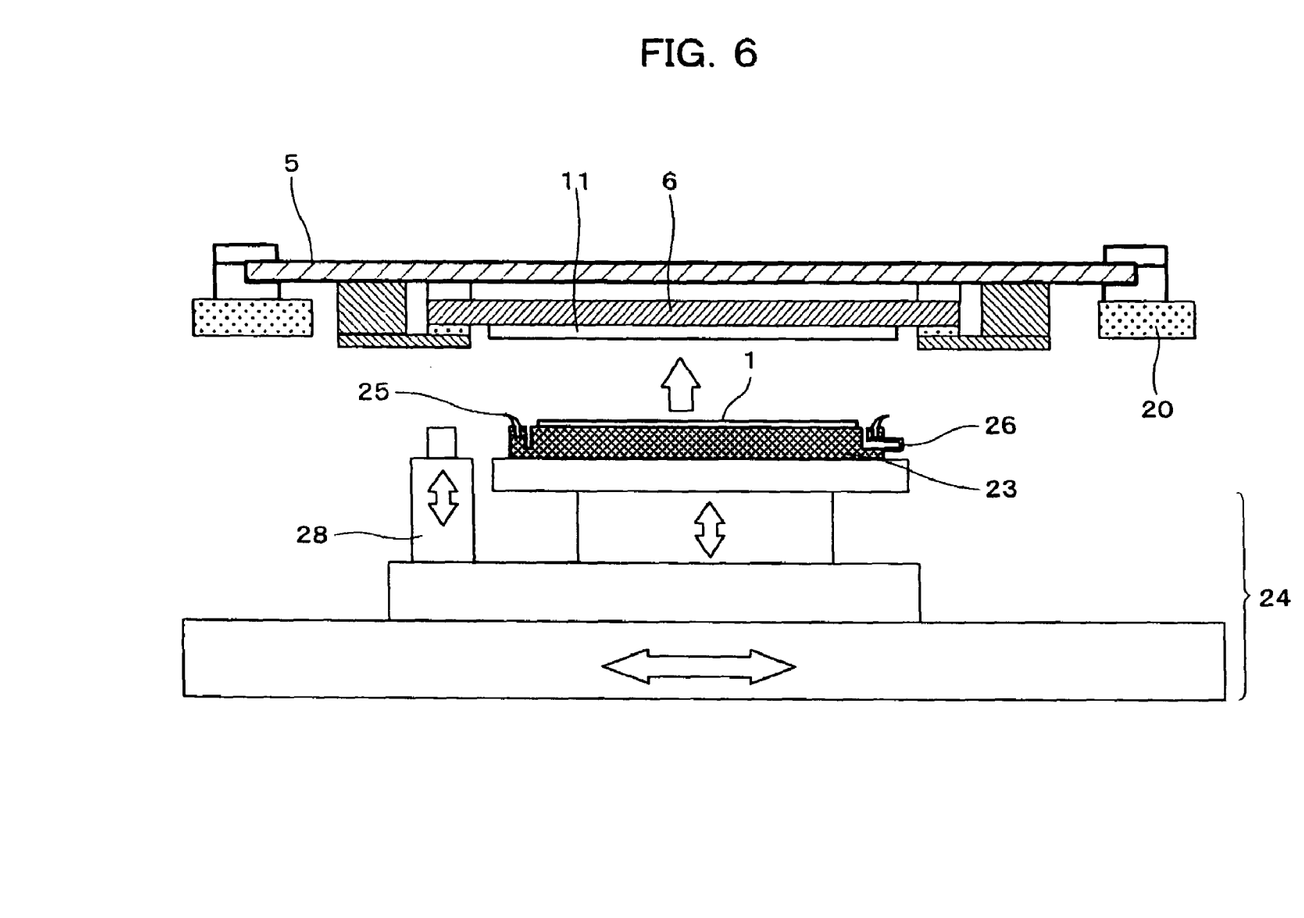
FIG. 6 is a sectional view showing the operation of the alignment apparatus shown in FIG. 5.

As shown in FIGS. 5 and 6, the inspection board 5 with the probe card 6 is mounted on a stage 20 and is positioned by means of inspection board positioning rollers 21 and inspection board positioning cylinders 22.

An XYZθ table 24 operated for alignment while a wafer tray 23 on which the wafer 1 is held by vacuum attraction is placed below the stage 20. XYZθ axes are controlled by means of a control motor and other components (not shown). In an outer peripheral portion of the wafer tray 23 are provided a seal ring 25 and a vacuum coupler 26 for evacuating a sealed space formed by the seal ring 25 when the seal ring 25 is brought into intimate contact with the object to be held. The vacuum coupler 26 is of an automatic closing type and is capable of keeping a condition in the sealed space when an evacuation nozzle is detached.

A wafer recognition camera 27 is attached to a back surface of the stage 20, while a bump recognition camera 28 is attached to the XYZθ table 24. The image recognition device (not shown) recognizes the positions of the electrodes 4 on the wafer 1 and the positions of the bumps 12 of the probe card 6 from images obtained by the cameras 27 and 28, and computes and determines an optimum contact position.

The operation at the time of alignment and contact will be described.

The wafer 1 is fixed by the vacuum chuck on the wafer tray 23 mounted on the XYZθ table 24. The electrodes 4 on the wafer 1 are imaged by the wafer recognition camera 27. An inclination of the wafer 1 from the XY axes of the XYZθ table 24 is corrected on the θ axis with reference to the positions and heights of the electrodes 4, and the coordinates of the center of the wafer 1 after correction are stored.

For example, electrodes 4, such as those indicated by hatching in FIG. 1, which exist on each of two pairs of the semiconductor integrated circuit devices 3 symmetric about the theoretical wafer center, and which are symmetric about the theoretical wafer center, are imaged by the wafer recognition camera 27. An inclination of the wafer 1 from the XY axes is obtained from two straight lines respectively connecting the symmetric pairs of the electrodes 4, and is corrected. Also, the center coordinates are obtained as a point of intersection of the straight lines. Further, the positions of the electrodes 4 from the obtained center coordinates and differences between the positions of the electrodes 4 and the corresponding theoretical positions are stored.

Next, the alignment marks 19 added to the contact probe 11 of the probe card 6 on the inspection board 5 positioned on the stage 20 are imaged by the bump recognition camera 28. The center coordinates of the contact probe 11 and an inclination of contact probe 11 from the XY axes of the XYZθ table 24 are obtained with reference to the alignment marks 19 and are stored.

For example, two pairs of alignment marks 19, such as those shown in FIG. 4A, symmetric about the theoretical probe center are imaged by the bump recognition camera 28. An angular difference of the contact probe 11 from the XY axes is obtained from two straight lines each connecting centers of the alignment marks 19 on the opposite sides of the theoretical probe center. Also, the center coordinates are obtained as a point of intersection of the straight lines. Further, the positions of the alignment marks 19 from the obtained center coordinates and differences between the theoretical positions of the alignment marks 19 and the corresponding theoretical positions are stored.

If there are no differences between the centers of the electrodes 4 and the alignment marks 19 to be imaged and processed and the respective theoretical center coordinates, the center coordinates of the wafer 1 and the center coordinates of the contact probe 11 are adjusted to each other. Also, an optimum contact position of the wafer 1 is determined such that the inclination of the wafer 1 is adjusted to the inclination of the contact probe 11 from the XY axes of the XYZθ table 24. If there are differences from the theoretical positions, the center coordinates of the wafer 1 and the center coordinates of the contact probe 11 are not adjusted. Instead, an optimum contact position is computed such that the differences of the recognized positions from the theoretical position are averaged. The wafer 1 is then positioned (aligned). According to a tendency heretofore confirmed, the differences of the positions of the electrodes 4 on the wafer side 1 from the theoretical positions are negligibly small because of the production system, and computation of an optimum position is required only on the contact probe 11 side.

After the completion of alignment, the wafer tray 23 is lifted to a certain height to bring all the electrodes 4 on the wafer 1 on the wafer tray 23 and all the bumps 12 on the probe card 6 into contact with each other. To maintain the contact condition, the sealed space between the wafer 1 and the contact probe 11 is evacuated through the vacuum coupler 26. By a force produced from atmospheric pressure outside the sealed space and uniformly applied, the bumps 12 of the contact probe 11 are maintained in contact with the electrodes 4 on the entire surface of the wafer 1.

After the desired contact has been achieved, the probe card 6, the wafer 1 and the wafer tray 23 in an integrally combined state are put in the inspection system and electrical inspection is performed by applying a voltage under a high-temperature condition. After the completion of inspection, the probe card 6, the wafer 1 and the wafer tray 23 are taken out of the inspection system. The pressure in the sealed space is then recovered to a level about atmospheric pressure, the wafer tray 20 is separated from the probe card 6, and the wafer 1 is taken out.

Simultaneously bringing the bumps 12 on the probe card 6 into reliable contact with the corresponding several ten thousands or more of electrodes 4 formed on the entire surface of the wafer 1 requires execution of alignment between the probe card 6 and the wafer 1 with high accuracy before making the above-described contact. Detailed description will be made of this alignment.

Figure 7A:
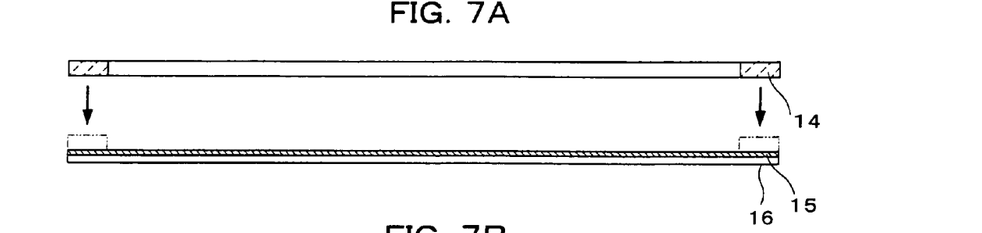
FIGS. 7A to 7E are sectional views showing a method of manufacturing the probe card of the present invention.

Description will first be made of the probe card 6. The contact probe 11 of the probe card 6 has the thin film 13 with bumps retained by the ceramic ring 14, as described above. For manufacture of this contact probe 11, a film, e.g., a two-layer film formed of a polyimide thin film 15 having a thickness of about 18 μm and a copper thin film 16 having a thickness of about 35 μm as shown in FIG. 7A is prepared as a base material for the thin film 13 with bumps.

A thermosetting adhesive (having a setting temperature of about 170° C.) is applied thinly and uniformly on a side surface of the ceramic ring 14 having a thickness of 2 mm and a frame width of about 9 mm, and the ceramic ring 14 with the adhesive is placed on the polyimide thin film 15. The ceramic ring 14 and the thin film 15 in this state are put in a heating furnace to thermally set the adhesive, thereby bonding and fixing the ceramic ring 14 and the thin film 15.

At this time, the thin films 15 and 16 are bonded in a sate of being largely expanded relative to the ceramic ring 14 due to the difference between the thermal expansion coefficient of polyimide (about $16 \times 10^{-6}$/° C.) and the thermal expansion coefficient of the ceramic (about $3 \times 10^{-6}$/° C.). When the temperature of these members is returned from the adhesive setting temperature 170° C. to ordinary temperature, the polyimide thin film 15 is fixed on the ceramic ring 14, with a certain tension maintained therein. By obtaining this tension, the desired position accuracy of bumps 12 and 12b formed in a following step is ensured.

Figure 7B:
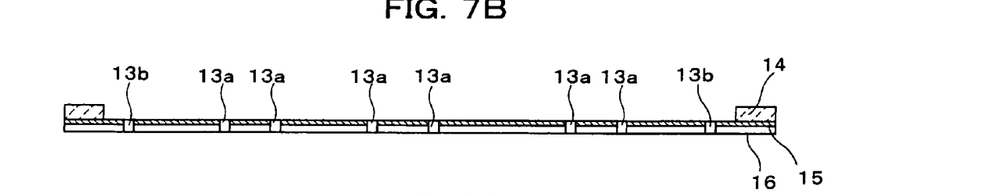

Subsequently, a multiplicity of holes 13a (having an inside diameter of about 20 to 30 μm) for forming bumps are formed in the sheet of base material attached to the ceramic ring 14, as shown in FIG. 7B. Holes 13b for bumps used as alignment marks 19 are simultaneously formed.

Figure 7C:
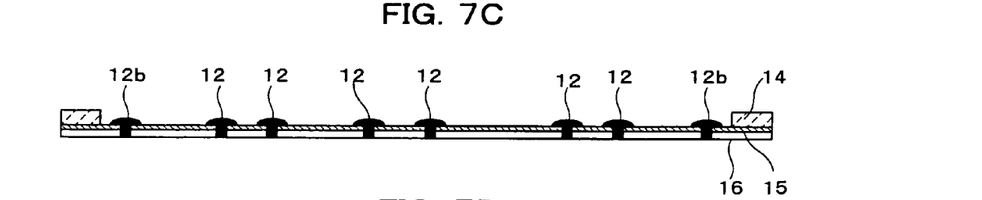

Subsequently, all the holes 13a and 13b are filled with a metallic material such as Ni by using electrolytic plating or the like to simultaneously form bumps 12 and 12b in all the holes 13a and 13b, as shown in FIG. 7C. For example, the bumps 12a and 12b have a height of about 40 μm and a diameter of about 60 μm.

Figure 7D:
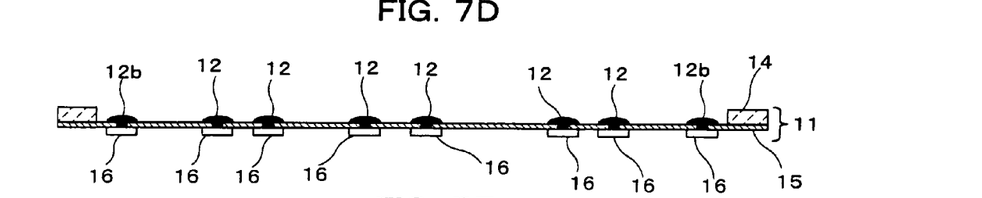
Figure 7E:
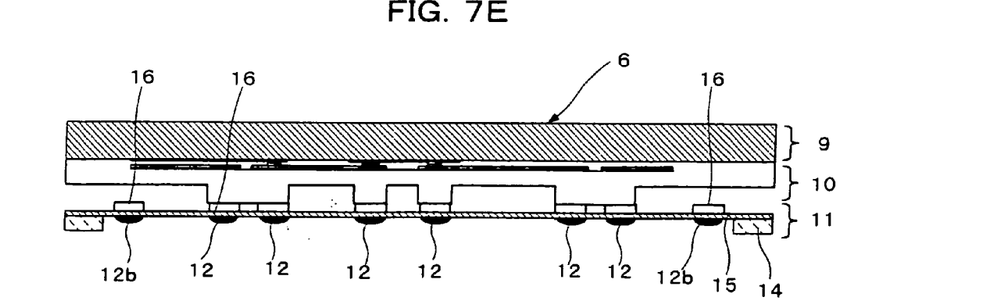

Thereafter, the copper thin film 16 superposed on the polyimide thin film 15 is etched so that its portions at the bumps 12 and 12b are left, thereby obtaining the contact probe 11 in which the thin film 13 with bumps are held on the ceramic ring 14, as shown in FIG. 7D. The probe card 6 is completed, as shown in FIG. 7E.

In this process, the holes 13a for forming bumps and the holes 13b for forming alignment marks 19 are simultaneously formed and filled, as described above. In this way, the method of the present invention ensures that the positional relationship between bumps 12 for contact and alignment marks 19 (bumps 12b) can be maintained with higher accuracy in comparison with any other method.

It is significantly important to maintain the relative positions of bumps 12 and alignment marks 19 in the method of determining the positions of bumps 12 with reference to alignment marks 19. Since the position accuracy of bumps 12 and 12b depends largely on the position accuracy of holes 13a and 13b, the hole working accuracy is significantly important. Laser working or the like is preferred as a hole working method because it provides a substantiall hole working accuracy and is also easily adaptable to changes in the working process, including change of the hole position according to a product variation, and because it is blind-hole working through the polyimide thin film only, enabling the copper thin film to be left for formation of bumps 12 by plating. The selection of positions at which bumps 12 are to be formed depends on the positions of the electrodes 4 on the wafer 1 to be inspected.

Use of the probe card 6 having the thus-formed contact probe 11 ensures that a change in position accuracy of the bumps 12 for contact can be easily measured with an image processor with reference to the alignment marks 19; an optimum contact position with respect to the electrodes 4 of the wafer 1 to be inspected can be computed from the measurement result; and alignment at the optimum position can be performed. Also, accurate and stable contact can be achieved. The probe card is suitably used particularly as a probe card designed to meet a demand for a flexible accurate arrangement of bumps, e.g., a probe card used for wafer-batch inspection such as wafer-level burn-in inspection.

Since the method of the present invention uses special-purpose alignment marks, it has advantages described below in comparison with the conventional method using part of bumps for contact.

While bumps for contact are provided at various positions according to variations of the semiconductor integrated circuit device, the special-purpose alignment marks can be added at fixed positions regardless of variations of the semiconductor integrated circuit device. Therefore, variation in quality among lots in manufacture of the probe card can be grasped easily and there is no need to set the image processing operation with respect to each variation of the semiconductor integrated circuit device on the alignment apparatus side. The inspection process can be speedily adapted to a new product variation.

Bumps for contact are densely arranged (e.g., with a pitch of 120 μm or less). Therefore there is a possibility of a fault such as an error in determining the bump positions. However, the special-purpose alignment marks can be added at arbitrary positions with an arbitrary bump pitch and can, therefore, be arranged without such a fault.

The tips of bumps for contact are worn away or a contamination is attached thereto during use of the bumps repeatedly brought into contact with inspection electrodes. Such wear or contamination may affect image processing. However, the bumps of the special-purpose alignment marks are free from wear and contamination during long-term use and do not affect image processing, since they do not contact inspection electrodes.

The method of the present invention has advantages described below even in comparison with the conventional method including adding special-purpose alignment marks.

The position accuracy of bumps formed on a thin film is largely influenced by expansion and shrinkage of the thin film. In the conventional method, alignment marks are added after the formation of bumps by considering the position accuracy of the bumps to avoid the influence of expansion and shrinkage of the thin film, as described above. However, the conventional method is capable of coping with the problem relating to the position accuracy at the time of manufacture of a probe card but is incapable of coping with, for example, a change due to a thermal cycle after manufacture of the probe card, and entails a problem that an accuracy error occurs with respect to the bump positions in the alignment mark addition step, as described above.

In contrast, the alignment marks (bumps) in accordance with the present invention are formed simultaneously with the bumps for contact. Therefore, if the desired position of the alignment marks relative to the bumps for contact is maintained in the manufacturing process, a change in the bump position accuracy due to expansion/shrinkage of the thin film can easily be determined by measuring the alignment marks, and an optimum position of the object with respect to the inspection electrodes can be computed by performing image processing on the change in bump position accuracy in the alignment apparatus. Thus, stable contact can be achieved. In a case where the results of position computation show that expansion/shrinkage is so large that an optimum position cannot be obtained, the contact operation is aborted to prevent damage to the semiconductor integrated circuit devices due to a contact misalignment.

A positional deviation of the bumps 12 on the thin film 13 with bumps may occur, depending on the manufacturing method. In the above-described case of forming bumps 12 by providing a multiplicity of holes in the sheet of base material in which polyimide thin film 15 and copper thin film 16 form two layers, the greater part of copper thin film 16 is finally removed and, therefore, stress relaxation due to removal of copper thin film 16 occurs in polyimide thin film 15 tensed by attachment to the ceramic ring 14. The bumps 12 are thereby changed in position from the state before removal of copper thin film 16 to the state after removal of copper thin film 16. That is, bump rearrangement occurs due to stress relaxation. The degree to which the positions of the bumps 12 are changed also depends on the bump 12 formation positions and the pattern of left copper thin film 16. A final bump 12 position accuracy of ±10 to 15 μm has been achieved by factoring in the amount of change of the worked positions of the holes for bumps 12 due to the stress relaxation in determination of the positions of bumps 12.

In some case, however, stress relaxation by removal of copper thin film 16 is uneven because of variation in the process of manufacturing the thin film 13 with bumps or variation in the process of bonding to the ceramic ring 14, and does not occur uniformly through the entire surface of the thin film 13 with bumps. Even if a certain degree of position accuracy of the contact probe 11 in a single state is ensured, there is a need to make contact by computing a position optimized according to unevenness of stress relaxation in order to realize stable contact. In achieving this, the design and layout of alignment marks 19 are also important.

Description will be made of the alignment marks formed on the probe card 6.

Figure 8A:
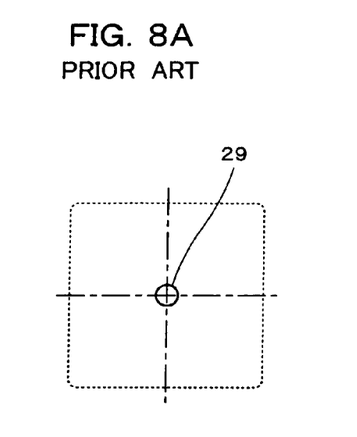
FIG. 8A is a diagram showing the design of a conventional alignment mark.

FIG. 8A shows the design of a conventional alignment mark 29. The alignment mark 29 is formed as an opening having a diameter of about 10 to 20 µm by using a laser beam, and is added at an optimum position after actually forming bumps 12 for contact with electrodes 4 on the wafer 1, measuring the position accuracy thereof and recognizing a position error.

Since this alignment mark 29 is added after the formation of bumps 12 as described above, an error may occur in the positional relationship with the bumps 12 in the addition step. Also, it is extremely difficult to image the alignment mark 29 with stability by the image processor. Since polyimide thin film 15 to which the alignment mark 29 is added is translucent, the boundary between the opening and the portion surrounding the opening cannot appear clearly. Also, since the opening is extremely small, there is a possibility of failure to discriminate the alignment mark 29 from a contamination or a scratch on thin film 15 or a background pattern seen through thin film 15.

Figure 8B:
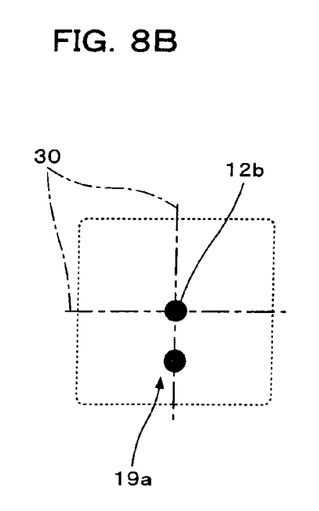
FIGS. 8B to 8D are diagrams showing the designs of alignment marks of the probe card of the present invention.
Figure 8C:
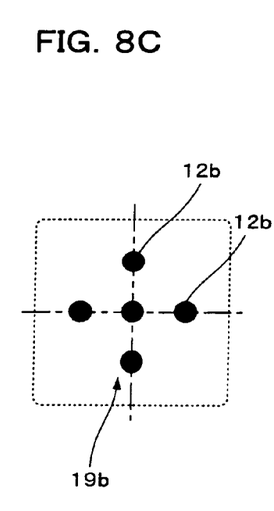
Figure 8D:
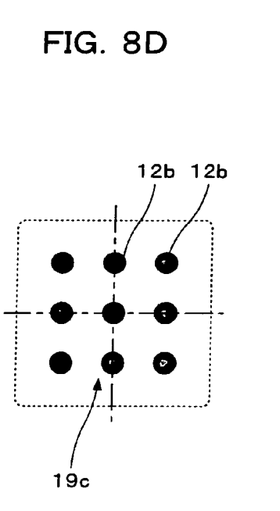

FIGS. 8B to 8D show alignment mark designs relating to the present invention.

The alignment mark 19a shown in FIG. 8B is formed of two bumps 12b vertically arranged. The alignment mark 19b shown in FIG. 8C is formed of five bumps 12b arranged vertically and horizontally in a crisscross configuration. The alignment mark 19c shown in FIG. 8D is formed of nine bumps 12b arranged vertically and horizontally in three rows.

The bumps 12b of each of the alignment marks 19a, 19b, and 19c are formed on polyimide thin film 15 simultaneously with the bumps 12 for contact with the electrodes 4 by the same method as that of forming the bumps 12. That is, each bump 12b is formed into a semispheric shape as Ni plating by using a plating process. The desired positional relationship between the bumps 12b and the bumps 12 for contact can be maintained. The bumps 12b can be displayed as dark portions at the time of image reading, such that the boundaries between the bumps 12b and the background can be clearly seen, as shown in the figures.

However, since the bumps 12b of these alignment marks 19a, 19b, and 19c are formed simultaneously with the bumps 12 by the same method as that of forming the bumps 12, the diameter of the bumps 12b is about 60 µm and instability of image taking remains such that the alignment mark cannot be discriminated from a contamination or a scratch on thin film 15, although each of the alignment marks 19a, 19b, and 19c is larger than the conventional alignment mark 29 formed by using a laser beam. Also, because of the forming method using a plating process, the bumps 12b may have a deformed semispheric shape. If the bump 12b having such a shape is imaged, the centroid position is largely shifted to cause an error in the position computation result. For the purpose of minimizing such faults, a plurality of bumps 12b are densely arranged in each of the alignment marks 19a, 19b, and 19c. In this way, the bumps 12b can be differentiated from contaminations, scratches or the like. Also, the position coordinates can be computed without being considerably influenced by the finish of each bump 12b in a single state.

The coordinate position computed as the alignment mark 19a, 19b, or 19c is a point of intersection of crossing lines 30 shown in the figure. The alignment mark 19a is an array of two bumps 12b, but the recognition device stores the coordinates of the theoretical point is intersection therebetween. Therefore, the coordinates of the actual point of intersection can be easily computed on an image of the mark by using the direction of arrangement of the two bumps 12b.

In a case where five-point design such as the alignment mark 19b in which bumps 12b are placed in a crisscross configuration (radial configuration) about a theoretical point of intersection is adopted, the position of the actual point of intersection can be obtained easily and stably from an image of the mark even when one of the bumps 12b cannot be taken into the image for some reason.

A design such as the alignment mark 19c in which nine bumps 12b are arranged vertically and horizontally in three rows can be said to be ideal, for example, because the stability of the finish of the bump shape is high, and because this arrangement is not possible in the layout of the electrodes 4 and can be differentiated from the bumps 12 for contact with the electrodes 4. The pitch between the bumps 12b may be set to about 100 µm.

Even in a case where alignment marks each formed of only one bump are formed, the coordinates of an actual point of intersection can be computed by using the coordinates of a theoretical point of intersection, although the shape instability problem remains. Also in such a case, the desired positional relationship between the alignment marks and the bumps 12 for contact can also be ensured.

Forming only one bump of an increased size as alignment mark 19 and forming a bump by Ni plating on the conventional alignment mark 29 (i.e., an opening) are also conceivable. However, it is essentially possible to form several ten thousands of bumps 12 uniformly on the entire surface of the contact probe 11 by putting the entire sheet of base material in a plating bath and performing plating on the base material. Increasing the size of only the bumps to be used as alignment marks requires partially changing plating conditions. It is extremely difficult to do so. Disadvantageously, the stable formation of the bumps is influenced by changing the plating conditions. It is also difficult to form a bump on the conventional alignment mark 29 (opening), because partial plating formation is required. Also, disadvantageously, copper thin film 16 is left only on portions of the back surface corresponding to peripheral portions of the bumps 12, it is difficult to supply a current through the remaining copper thin film 16.

The above-described method of forming the alignment mark 19a, 19b, or 19c of a characteristic design by densely forming bumps 12b by the same process as that used to form bumps 12 for contact can be said to be a method for stable coordinate computation.

Figure 9A:
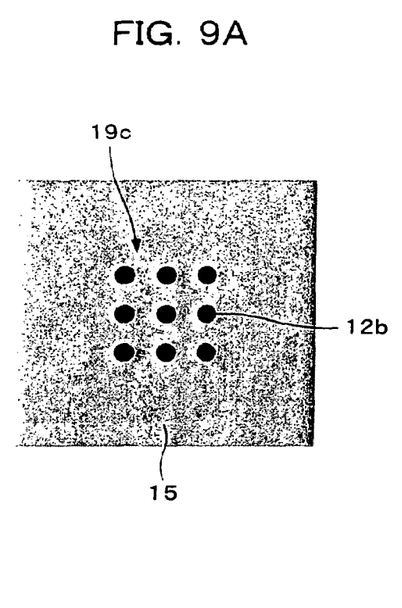
FIGS. 9A and 9B are diagrams showing images of the alignment mark of the probe card of the present invention.
Figure 9B:
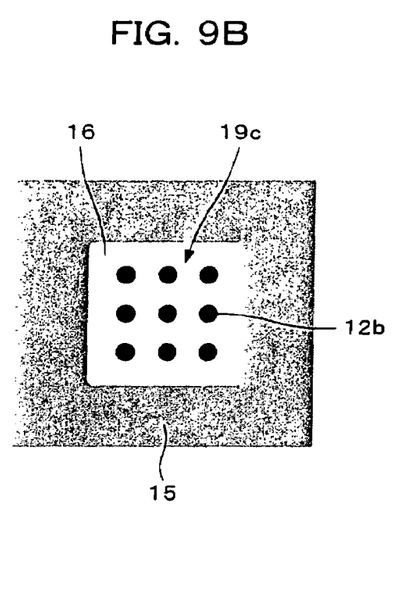

FIGS. 9A and 9B show imaged states of an alignment mark.

In FIG. 9A, the background behind the alignment mark 19c is darkly shown. This image is obtained in a case where the bumps 12b of the alignment mark 19c are formed in the same manner as the bumps 12 for contact described above with reference to FIG. 4, while only portions of the copper thin film 16 at the bumps are left on the back surface of the thin film 15. Localized anisotropic conductive rubber 10 exists on the back side of the thin film 13 with bumps, as described above. This localized anisotropic conductive rubber 10 ordinarily has a dark color. Therefore the localized anisotropic conductive rubber 10 seen through the thin film 15 in the background behind the alignment mark 19c is darkly shown.

In FIG. 9B, the background behind the alignment mark 19c is whitely shown. This is because a portion of the copper thin film 16 larger in size than the alignment mark 19c is left in order to minimize image taking error. The copper thin film 16 is whitely shown in the background behind the alignment mark 19c without any influence of the localized anisotropic conductive rubber 10 on the back side of the thin film 13 with bumps. In contrast with the copper thin film 16, the outer boundaries of the bumps 12b are clearly imaged with a light-dark contrast. Therefore the center coordinates of the alignment mark 19c can be easily computed with stability.

As a method for largely leaving copper thin film 16 relative to the alignment mark 19c as described above, designing an etching mask for leaving copper thin film 16 at the rear of the bumps 12 for contact by considering use for the alignment mark 19c in making of the etching mask may suffice. Advantageously, this method is simple but highly effective in stabilizing image taking and can be implemented without increasing the manufacturing cost of the contact probe 11.

Each of the alignment mark 19c and other alignment marks in accordance with the present invention, using bumps 12b other than the bumps 12 for contact, is placed in an outer peripheral portion of the contact probe 11 by avoiding placement in the measurement bump area 17 where the bumps 12 are arrayed, thereby enabling copper thin film 16 to be largely left and achieving a free-design free-layout effect. In contrast, the conventional art in which bumps for contact are used as a key for alignment, the image taking stabilization method using copper thin film as described above cannot be used because the bump pitch is smaller than 120 μm in some case, and because the copper film size cannot be substantially increased.

Figure 10:
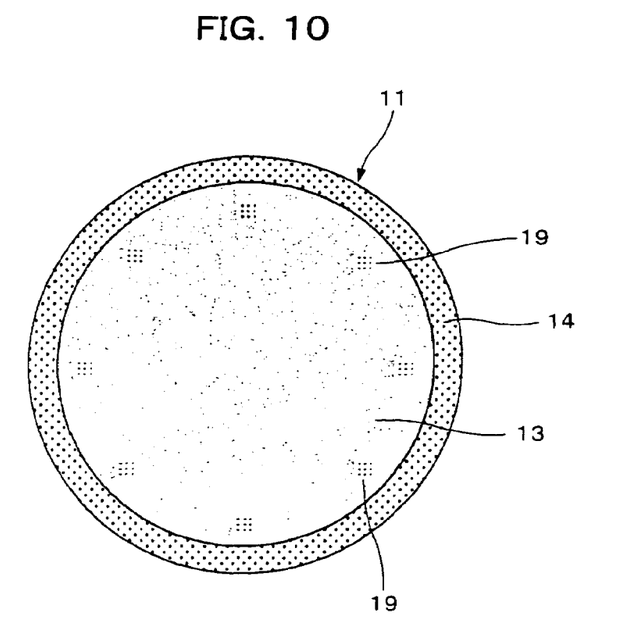
FIG. 10 is a plan view of an alignment mark layout on the probe card of the present invention.

FIG. 10 shows an alignment mark layout in the probe card.

Alignment marks 19 are provided in eight places at equal intervals in the circumferential direction in an outer peripheral portion of the thin film 13 with bumps closer to the ceramic ring 14 in the contact probe 11. The alignment mark 19c described above with reference to FIG. 8D is shown as each alignment mark 19. However, the alignment mark 19 is not limited to the alignment mark 19c.

As described above, bump rearrangement occurs in the thin film 13 with bumps due to stress relaxation in the manufacturing process. In some case, bump rearrangement occurs not uniformly over the entire surface of the thin film 13 with bumps. Also, the non-uniformity of bump rearrangement may be increased during repeated heating at about 125° C. in the inspection system after contact. Therefore, it is always necessary to control the bump position accuracy immediately before contact as well as at the time of manufacturing of the contact probe 11. If a contact probe 11 deviating from a standard position accuracy is used, the bumps 12 may be detached from the contact-target electrodes 4. In such a case, inspection cannot be normally performed and a bump trace may be left on a portion other than the electrodes 4 to make the corresponding semiconductor integrated circuit device defective.

For control of unevenness of the bump position accuracy, alignment marks 19 may be laid out at least in four places in an outer peripheral portion closer to the ceramic ring 14. The influence of expansion/shrinkage of the thin film caused in the step of manufacturing the thin film 13 with bumps for example appears largely on the outer peripheral side. The alignment marks are formed in the corresponding portion. If the number of alignment marks 19 is not sufficiently large, occurrence of unevenness of the position accuracy of the bumps due to expansion/shrinkage of the thin film 13 with bumps for example cannot be grasped. It is preferable to provide a larger number of alignment marks 19 added to the thin film 13 with bumps in order to optimize the positions of the electrodes 4 and the bumps 12. From the tendency of unevenness heretofore recognized, it can be said that it is ideal to set alignment marks 19 in eight places.

Before alignment, the positions of the individual alignment marks 19 are measured by the image processor in the alignment apparatus and compared with the theoretical positions, an error therebetween is computed and determination is made as to whether or not the error is within a standard range such that the position accuracy is high enough to permit contact. If the error is within the standard range, alignment is performed at an optimum position considered to be optimum in the overall alignment with respect to the relationship with the electrodes 4, and contact is thereafter made. Accordingly, not only a function to compute a suitable position for contact between the electrodes 4 and the bumps 12 but also a function to measure the position accuracy of the alignment marks 19 (bumps 12b) of the contact probe 11 are added to the alignment apparatus to facilitate production control. If the error is out of the standard range, the probe card 6 is replaced.

If the number of alignment marks 19 is increased, the image processing time is naturally increased. However, since the inspection after the alignment process is burn-in inspection and requires at least several hours, a sufficiently long time may be spared for the alignment process according to a decision from the throughput of the production line, and there is no considerable problem with an increase in image processing time.

What is claimed is:

1. A probe card for a wafer level test of electrical characteristics of a plurality of semiconductor integrated circuit devices formed on a semiconductor wafer, said probe card comprising:

an insulating thin film held by a rigid ring;

a plurality of first bumps on the insulating thin film for contacting inspection electrodes of a plurality of semiconductor integrated circuit devices;

a plurality of alignment marks on the insulating thin film, and a conductive thin film on a surface of the insulating thin film behind each of the alignment marks, the conductive thin film being larger in area than the alignment mark to contrast with the plurality of second bumps forming the alignment marks during image processing using a recognition camera, wherein each of the alignment marks comprises a plurality of second bumps formed simultaneously with the first bumps that do not contact said inspection electrodes, the plurality of second bumps positioned closely to one another.

2. The probe card according to claim 1, wherein the plurality of alignment marks includes at least two pairs of alignment marks formed on an outer periphery of a region where the first bumps for contact are formed, each pair of alignment marks comprising two alignment marks symmetric with respect to a center of the insulating thin film.

* * * * *